(12) United States Patent
Noh

(10) Patent No.: US 11,088,403 B2
(45) Date of Patent: Aug. 10, 2021

(54) METHOD FOR PREVENTING SWELLING OF BATTERY CELL AND BATTERY PACK USING SAME

(71) Applicant: LG CHEM, LTD., Seoul (KR)

(72) Inventor: Seung Jin Noh, Cheongju-si (KR)

(73) Assignee: LG CHEM, LTD., Seoul (KR)

( * ) Notice: Subject to any disclaimer, the term of this patent is extended or adjusted under 35 U.S.C. 154(b) by 192 days.

(21) Appl. No.: 16/477,707

(22) PCT Filed: Sep. 18, 2018

(86) PCT No.: PCT/KR2018/010998
§ 371 (c)(1),
(2) Date: Jul. 12, 2019

(87) PCT Pub. No.: WO2019/066358
PCT Pub. Date: Apr. 4, 2019

(65) Prior Publication Data
US 2019/0363407 A1   Nov. 28, 2019

(30) Foreign Application Priority Data
Sep. 28, 2017 (KR) .................. 10-2017-0126419

(51) Int. Cl.
  *H01M 10/46* (2006.01)
  *H01M 10/44* (2006.01)
  (Continued)

(52) U.S. Cl.
  CPC ......... *H01M 10/443* (2013.01); *H01M 10/46* (2013.01); *H01M 10/486* (2013.01); *H02J 7/007* (2013.01)

(58) Field of Classification Search
  CPC .. H01M 10/443; H01M 10/46; H01M 10/486; H01M 2200/00; H01M 10/425;
  (Continued)

(56) References Cited

U.S. PATENT DOCUMENTS 6,118,255 A    9/2000 Nagai et al.
10,044,073 B2  8/2018 Jun et al.
(Continued)

FOREIGN PATENT DOCUMENTS

JP   H6-70478 A   3/1994
JP   7-183051 A   7/1995
(Continued)

OTHER PUBLICATIONS

Extended European Search Report dated Mar. 11, 2020, for European Application No. 18860643.8.
(Continued)

*Primary Examiner* — Nghia M Doan
(74) *Attorney, Agent, or Firm* — Birch, Stewart, Kolasch & Birch, LLP

(57) ABSTRACT

A method for preventing swelling of a battery cell in advance by counting a time while a temperature and a cell voltage of the battery cell are maintained equal to or greater than respective reference values, and by dropping a charging voltage to lower the temperature and the cell voltage of the battery cell, when the time is a reference time or longer.

10 Claims, 2 Drawing Sheets

(51) Int. Cl.
*H01M 10/48* (2006.01)
*H02J 7/00* (2006.01)

(58) Field of Classification Search
CPC ........ H01M 10/48; H01M 10/44; H02J 7/007; Y02E 60/10; G01R 31/36
See application file for complete search history.

(56) References Cited

U.S. PATENT DOCUMENTS

| | | | |
|---|---|---|---|
| 2011/0148363 A1* | 6/2011 | Frisch | G01R 19/16542 |
| | | | 320/162 |
| 2012/0019197 A1 | 1/2012 | Lee et al. | |
| 2012/0025771 A1 | 2/2012 | Bhardwaj et al. | |
| 2014/0002029 A1 | 1/2014 | Sameshima | |
| 2015/0009595 A1 | 1/2015 | Nishina et al. | |
| 2016/0149423 A1* | 5/2016 | Liu | G01R 31/382 |
| | | | 320/134 |

FOREIGN PATENT DOCUMENTS

| | | |
|---|---|---|
| JP | 11-150883 A | 6/1999 |
| JP | 2000-348777 A | 12/2000 |
| JP | 2002-525019 A | 8/2002 |
| JP | 2007-220494 A | 8/2007 |
| JP | 2007-228701 A | 9/2007 |
| JP | 2009-208639 A | 9/2009 |
| JP | 2010-183830 A | 8/2010 |
| JP | 2011-115040 A | 6/2011 |
| JP | 2011-182540 A | 9/2011 |
| JP | 2012-157128 A | 8/2012 |
| JP | 202-210113 A | 10/2012 |
| JP | 2012-196001 A | 10/2012 |
| JP | 2015-15799 A | 1/2015 |
| JP | 2016-93066 A | 5/2016 |
| JP | 6201750 B2 | 9/2017 |
| KR | 10-2012-0010029 A | 2/2012 |
| KR | 10-1242455 B1 | 3/2013 |
| KR | 10-2016-0129626 A | 11/2016 |
| KR | 10-1736419 B1 | 5/2017 |
| KR | 10-2017-0082262 A | 7/2017 |

OTHER PUBLICATIONS

International Search Report issued in PCT/KR2018/010998 (PCT/ISA/210), dated Dec. 26, 2018.

* cited by examiner

[FIG. 1]
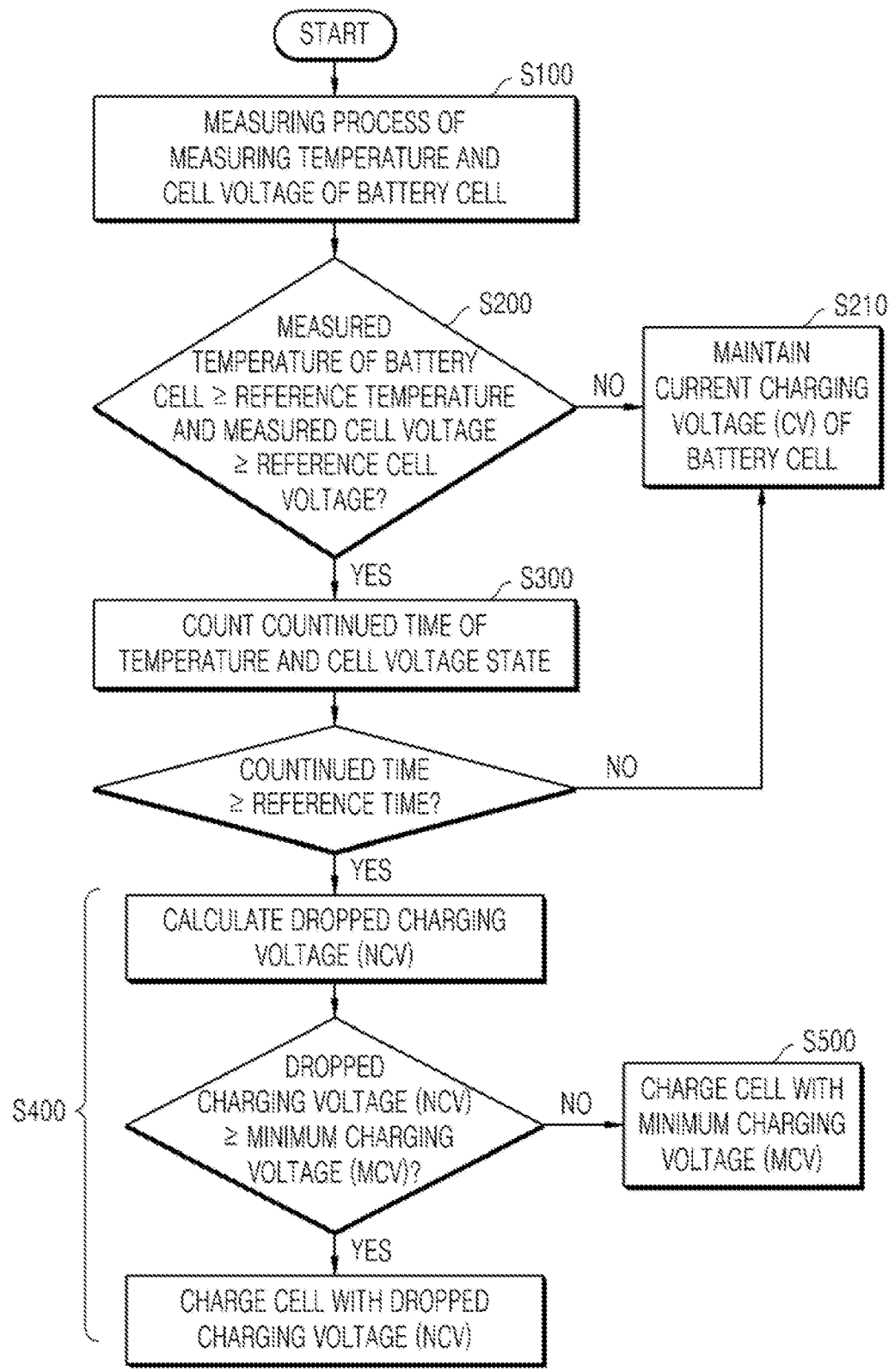

【FIG. 2】
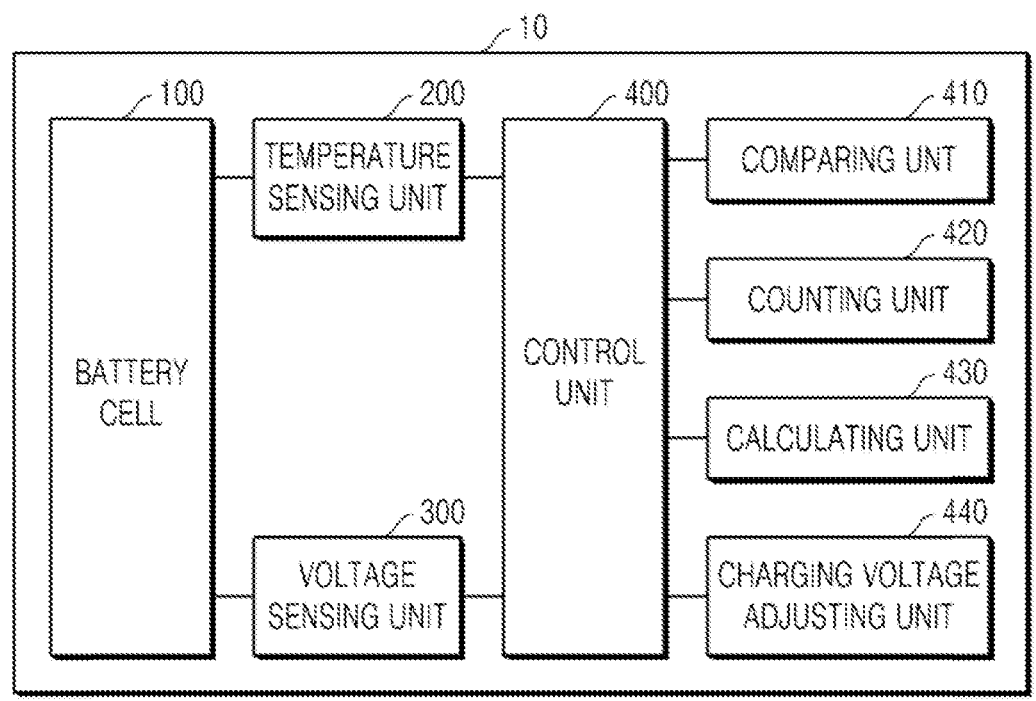

METHOD FOR PREVENTING SWELLING OF BATTERY CELL AND BATTERY PACK USING SAME

TECHNICAL FIELD

The present disclosure relates to a method for preventing swelling of a battery cell and a battery pack manufactured using the same, and more particularly, to a method for preventing swelling of a battery cell and a battery pack manufactured using the same which prevent a swelling phenomenon from occurring through a charging voltage control according to a temperature and a voltage of a battery cell being in charge.

BACKGROUND ART

A battery is easily applicable to a product according to a product group, and has characteristics of excellent preservation and high energy density, etc. In addition, the battery has a primary merit of being able to reduce a use of fossil fuel, and attracts attention as an eco-friendly energy supplying source for enhancing energy efficiency in that by-products are not produced according to a use of energy.

A battery is typically applied to an electrical vehicle, an energy storage system and the like as well as a mobile device. The battery is also foundational to various industries and provides convenience to daily life.

However, such a battery may be abnormally driven according to a use environment, and when, for example, the battery is overcharged or the life is exhausted, a swelling phenomenon of the battery may be induced by an electrical-chemical process generated inside the battery.

Such a swelling phenomenon of the battery may not only cause life shortening or capacity lowering, but be also connected to an accident such as ignition and explosion. Therefore, it is required to stably use the battery through careful monitoring and a suitable control.

Accordingly, various researches and developments have been performed in relation to sensing of the swelling phenomenon of the battery and battery protection, and for example, a technology has been used which senses a volume change of a battery cell according to swelling using a pressure measurement means and prevents current from flowing therethrough.

However, since such physical volume expansion of the battery cell is resulted from sufficient swelling, it is difficult to sense and handle the swelling phenomenon of the battery cell in an early stage. Even when the current is cut off, it is highly dangerous to cause ignition by the swelling having sufficiently proceeded already.

DISCLOSURE OF THE INVENTION

Technical Problem

The present disclosure relates to a method for preventing swelling of a battery cell and a battery pack manufactured using the same which may efficiently improve stability of the battery pack by preventing in advance a cause for swelling of the battery cell.

Technical Solution

In accordance with an exemplary embodiment, a method for preventing swelling of a battery cell, including: a measuring process of measuring a temperature and a cell voltage of the battery cell in charge; a determining process of determining whether the measured temperature and the measured cell voltage of the battery cell are equal to or greater than a reference temperature and a reference cell voltage, respectively; a counting process of starting counting from a time when the temperature and the cell voltage of the battery cell become equal to or greater than the reference temperature and the reference cell voltage, respectively; a cell charging process of charging the battery cell with a dropped charging voltage (NCV) obtained by dropping a charging voltage (CV) of the battery cell by a preset setting voltage (DV), when the counted time is a set reference time or longer; and a minimum charging voltage maintaining process of maintaining the dropped charging voltage (NCV) to a preset minimum charging voltage (MCV) or greater.

In the determining process, when the measured temperature or the measure cell voltage of the battery cell may be smaller than the reference temperature or the reference cell voltage, respectively, the charging voltage is maintained to charge the battery cell.

In the counting process, when the counted time is shorter than the reference time, the charging voltage (CV) may be maintained to charge the battery cell.

In the cell charging process, the dropped charging voltage (NCV) may be calculated according to a following Equation (1), $$\text{Dropped charging voltage (NCV)} = \text{charging voltage (CV)} - \text{setting voltage (DV)} \quad \text{Equation (1)}$$

In the minimum charging voltage maintaining process, when the dropped charging voltage (NCV) is the minimum charging voltage (MCV) or greater, the battery cell may be charged with the dropped charging voltage (NCV), and when the dropped charging voltage (NCV) is smaller than the minimum charging voltage (MCV), the battery cell may be charged with the minimum charging voltage (MCV).

In accordance with another exemplary embodiment, a battery pack includes: a battery cell; a temperature sensing unit configured to measure a temperature of the battery cell; a voltage measuring unit configured to measure a cell voltage of the battery cell; and a control unit configured to control the charging voltage (CV) according to the temperature and the voltage respectively acquired from the temperature sensing unit and the voltage measuring unit, wherein the control unit includes: a comparing unit configured to compare the temperature and the cell voltage with a reference temperature and a reference voltage, respectively; a counting unit configured to count from a time when the measured temperature and the measured cell voltage are equal to or greater than the reference temperature and the reference voltage, respectively; a calculating unit configured to drop the charging voltage by a preset voltage, when the time counted by the counting unit is a reference time or longer; and a charging voltage adjusting unit configured to adjust the charging voltage.

The comparing unit may compare the temperature and the cell voltage with the reference temperature and the reference cell voltage, respectively, and transmit a counting signal to the counting unit, when the measured temperature and the measured cell voltage of the battery cell are equal to or greater than the reference temperature and the reference cell voltage, respectively.

The counting unit may further include: a second counter configured to count a time in seconds from a time when the counting signal has been transmitted; and an hour counter configured to count when the time counted by the second counter is a set time or greater.

The calculating unit may calculate the dropped charging voltage dropped by a present voltage from the charging voltage according to a following equation (1), when the counted time is a set time or greater, $$\text{Dropped charging voltage (NCV)} = \text{charging voltage (CV)} - \text{preset voltage (DV)} \quad \text{Equation (1)}.$$

The charging voltage adjusting unit may adjust the charging voltage such that the battery cell is charged with the dropped charging voltage calculated in the calculating unit, and when the dropped charging voltage is calculated to be smaller than a minimum charging voltage, the charging voltage adjusting unit may adjust the charging voltage such that the battery cell is charged with the minimum charging voltage.

Advantageous Effects

According to the present disclosure, the swelling phenomenon may be made not to occur on the basis of generation conditions of the swelling phenomenon of the battery cell, and thus an accident such as explosion of the battery pack or the electrolyte leakage may be prevented in advance which is caused by the swelling phenomenon.

Accordingly, the stability of the battery pack may be efficiently enhanced.

BRIEF DESCRIPTION OF THE DRAWINGS

FIG. 1 is a flowchart showing a method for preventing swelling a battery cell in accordance with an exemplary embodiment; and FIG. 2 is a block diagram schematically illustrating a configuration of battery pack in which swelling of a battery cell is prevented in accordance with an exemplary embodiment.

DETAILED DESCRIPTION OF EMBODIMENTS

Hereinafter, specific embodiments will be described in detail with reference to the accompanying drawings. Terms and words used herein should not be construed limitedly by the common and dictionary meanings, but should be interpreted by meaning and concepts conforming to the technical idea of this invention based on the principle that the concept of terms and words can be defined properly by the inventor in order to describe the present disclosure in the best ways.

Accordingly, it should be apparent to those skilled in the art that the following description of exemplary embodiments of the present disclosure are provided for illustration purpose only and not for the purpose of limiting the invention as defined by the appended claims and their equivalents. In addition, descriptions of known functions and configurations which have been deemed to make the gist of the present disclosure unnecessarily obscure will be omitted below.

Before describing a method for preventing swelling of a battery cell according to an embodiment of the present disclosure, a description about swelling of a battery will be provided.

The swelling or a swelling phenomenon of the battery cell refers to a phenomenon that pressure inside the battery cell abruptly increases and thus an external case of the battery cell abruptly swells. Such a swelling phenomenon may occur mainly by gas generation inside the cell, when a gas is generated by heat or ignition at an electrode of a lithium ion battery cell, or when a gas is generated by decomposition of an electrolyte, which is resulted from an overvoltage condition.

Under conditions that a high temperature equal to or higher than a reference temperature is maintained for a long time due to continuous heat at a cell electrode and a cell voltage of the battery cell equal to or higher than a reference voltage is maintained for a long time, the swelling phenomenon of the battery cell is highly possible to occur.

Typically, a notebook computer is manufactured to be used in a fully charged state of the battery without an external power supply, but most notebook computer users use the notebook computer while charging the battery thereof. Therefore, the swelling phenomenon is highly possible to occur. Accordingly, the method for preventing swelling of a battery cell according to an embodiment of the present disclosure is directed to prevent the swelling of the battery cell in this case.

Hereinafter, embodiments of the present invention will be described in detail with reference to the accompanying drawings.

FIG. 1 is a flowchart showing a method for preventing swelling a battery cell according to an embodiment of the present disclosure. Referring to FIG. 1, the method for preventing swelling of the battery cell according to the present invention includes a measuring process S100 of measuring a temperature and a cell voltage of a battery cell, a determining process S200 of determining whether the measured temperature and the measured cell voltage of the battery cell are equal to or greater than reference values, respectively, a counting process S300 of counting a time from a time point when the measured temperature and the measured cell voltage of the battery cell are equal to or greater than reference values, respectively, a cell charging process S400 of charging the battery cell with a dropped charging voltage obtained by dropping a charging voltage for charging the battery cell by a preset setting voltage, and a minimum charging voltage maintaining process S500 of maintaining the dropped charging voltage to a minimum charging voltage or higher.

In the measuring process S100, a current temperature and a current cell voltage of the battery cell are measured while the battery cell is in charge with the set charging voltage (CV). Here, the charging voltage (CV) is a voltage for currently charging the battery cell.

Here, the set charging voltage (CV) may be differed according to the specification in a manufacturing stage of the battery cell. For example, when a notebook computer battery is charged, the charging voltage (CV) may be a 5 V input via an adapter and a charging circuit, or the charging voltage (CV) may be 12 V according to the type of the battery cell.

In the determining process S200, the current temperature and the current cell voltage of the battery cell measured in the measuring process S100 are compared respectively with a preset reference temperature and a preset reference cell voltage of the battery cell.

Here, the reference temperature of the battery cell means that when the temperature of the battery cell is equal to or higher than that, the battery cell is exposed on a high temperature and a gas is actively generated therein. The reference cell voltage means a proper voltage set in a design stage of the battery cell.

Accordingly, in the determining process S200, the measured current temperature and the measured current cell voltage of the battery cell are respectively compared with the reference temperature and the reference cell voltage, and it is determined whether an abnormal state occurs in the battery cell according to the comparison result.

Here, when the measured temperature of the battery cell is smaller than the reference temperature, or the measured cell voltage is smaller than the reference cell voltage, the charging voltage maintaining process S210 operates such that the battery cell is charged with the charging voltage (CV) that is a voltage for charging currently the battery cell.

In the counting process S300, when it is determined that, in the determining process S200, the current temperature of the battery cell is the reference temperature or higher and the current cell voltage is the reference cell voltage or higher, a time is counted from that time point.

In the counting process S300, when the counted time is smaller than a reference time, the charging voltage (CV) is maintained (process S210) such that the charging voltage, which is a voltage for charging currently the battery cell, is maintained.

Here, the reference time means that when the temperature and the cell voltage of the battery cell are maintained respectively to be equal to or greater than the reference temperature and the reference cell voltage for a long time and become equal to or greater than the reference temperature and the reference cell voltage respectively, the swelling phenomenon may abruptly proceed.

In the cell charging process S400, when the counted time in the counting process S300 is the reference time or longer, a dropped charging voltage (NCV) is calculated by dropping the charging voltage (CV), with which the battery cell is currently being charged, by a preset setting voltage (DV).

The dropped charging voltage may be calculated according to Equation (1).

$$\text{Dropped charging voltage (NCV)} = \text{charging voltage (CV)} - \text{setting voltage (DV)} \quad (1)$$

In other words, that the counted time is the reference time or longer means that when the battery cell is continuously charged with the charging voltage CV that is a voltage for currently charging the battery cell, swelling is highly possible to occur due to a continuous abnormal state of the battery cell. Therefore, the dropped charging voltage (NCV) is calculated by dropping the charging voltage (CV), with which the battery cell is currently charged, by the preset setting voltage (DV), and then the battery cell is intended to be charged with the dropped charging voltage (NCV).

Accordingly, it is intended to lower a danger of occurrence of the swelling phenomenon according to continuous application of a high charging voltage and a temperature rise in the cell by allowing the battery cell to be charged with the dropped charging voltage (NCV) obtained by dropping the charging voltage (CV) with which the battery cell is currently charged.

Here, the setting voltage (DV) is allowed to be set at the time of manufacturing the battery cell.

For example, for a specific battery cell of which charging voltage (CV) is 5 V, the setting voltage (DV) is set to 0.8 V, and a voltage drop circuit may be configured in a charging circuit or a charger of a device so that the dropped charging voltage (NCV) is to be 4.2V. Such a voltage drop circuit may be constituted using a known technology.

In the cell charging process S400, the battery cell is charged with the calculated dropped charging voltage (NCV), and when the dropped charging voltage (NCV) is a minimum charging voltage (MCV) of the battery cell or higher, the battery cell is charged with the dropped charging voltage (NCV). However, when the dropped charging voltage (NCV) is smaller than the minimum charging voltage MCV of the battery cell, the minimum voltage maintaining process S500 is operated in which the battery cell is charged with the minimum charging voltage, not with the dropped charging voltage (NCV).

Here, the minimum charging voltage means the smallest charging voltage among charging voltages set for charging the battery cell, namely, the smallest voltage for charging the battery cell.

Accordingly, when the dropped charging voltage, which is calculated by dropping the current charging voltage (CV) of the battery cell by the preset setting voltage (DV), is smaller than the minimum charging voltage (MCV), it is determined that the battery cell may not be charged with the dropped charging voltage (NCV).

Accordingly, since the battery cell may not be charged with the dropped charging voltage (NCV) and the swelling is highly possible to occur when the battery cell is charged with the current charging voltage (CV), it is intended to reduce a danger of occurrence of the swelling by charging the battery cell with the minimum charging voltage that is the smallest voltage among the charging voltages.

Hereinafter, a description will be provided about a battery pack in which swelling is prevented from occurring in a battery cell according to an embodiment of the present disclosure.

FIG. 2 is a block diagram schematically illustrating a configuration of battery pack in which swelling of a battery cell is prevented according to an embodiment of the present disclosure.

Referring to FIG. 2, a battery pack 10 in which swelling is prevented from occurring in a battery cell according to an embodiment of the present disclosure includes the battery cell 100, a temperature sensing unit 200, a voltage measuring unit 300, and a control unit 400 configured to control a charging voltage according to a measured temperature and a measured cell voltage of the battery cell 100, and the control unit 400 may further include a comparing unit 410, a counting unit 420, a calculating unit 430, and a charging voltage adjusting unit 440.

The temperature sensing unit 200 includes a temperature sensor for measuring a temperature of the battery cell 100 at the time when the battery cell 100 starts to be charged with a set charging voltage and the temperature of the battery cell 100 increases by internal resistance.

In addition, in order to measure the temperature of the battery cell 100, the temperature sensing unit 200 may be attached to the outside of the battery cell 100 or inserted to be mounted inside the battery cell 100, but is not limited thereto, and any type to measure the temperature of the battery cell 100 is allowed.

The voltage measuring unit 300 is configured to be connected to a negative terminal and a positive terminal of the battery cell 100 and measure the voltage of the battery cell 100 in charge.

The control unit 400 is configured to be able to control the charging voltage with which the battery cell 100 is charged.

In addition, the control unit 400 further includes a comparing unit 410, a counting unit 420, a calculating unit 430, and a charge voltage adjusting unit 440 configured to control the charging voltage of the battery cell 100.

The comparing unit 410 compares the temperature of the battery cell 100 measured by the temperature sensing unit 200 with the reference temperature, compares the cell voltage measured by the voltage measuring unit 300 with the reference voltage, and generates a counting signal to transmit the counting signal to the counting unit 420, when the measured temperature and the measured cell voltage of the battery cell are equal to or greater than the reference temperature and the reference voltage, respectively.

On the contrary, when the temperature measured by the temperature sensing unit 200 is smaller than the reference temperature or the cell voltage measured by the voltage measuring unit 300 is smaller than the reference voltage, the comparing unit 410 transmits a charging voltage maintaining signal to the charging voltage adjusting unit 440 to allow the battery cell 100 to be charged with the charging voltage that is a voltage with which the battery cell is currently charged.

Here, the reference temperature indicates a temperature at which when the battery cell 100 is exposed thereto or higher for a long time, a chemical process by the internal temperature of the battery cell 100 is accelerated and a reaction gas may be abruptly generated. The reference cell voltage indicates a voltage at which when the battery is charged with a proper level or higher and then a high voltage is maintained for a long time, the reaction gas may be abruptly generated by an electrical process inside the battery cell 100.

Accordingly, when the current temperature and the current cell voltage of the battery cell are equal to or greater than the reference temperature and the reference voltage, respectively, and such a state is continued, it is determined that swelling is highly possible to occur in the battery cell. From this determination time point, the counting unit 420 to be described later is allowed to count a time while the current temperature and the current cell voltage of the battery cell are continued, and determines whether the battery cell is in an abnormal state.

Here, the reference temperature and the reference cell voltage of the battery cell may be set differently according to the specifications of the battery cell 100.

The counting unit 420 starts to count a time while the temperature and the cell voltage are maintained equal to or greater than reference values, respectively, from a time when the counting signal is transmitted from the comparing unit 410.

In addition, the counting unit 420 may further include a second counter 421 configured to perform counting in seconds when the counting starts, and a hour counter 422 configured to perform counting in hours after a prescribed time passed.

In addition, when a time counted by the counting unit 420 is equal to or greater than a reference time, the counting unit 420 transmits a time excess signal to the calculating unit 430.

On the contrary, when a time counted by the counting unit 420 is smaller than the reference time, the counting unit 420 transmits a charging voltage maintaining signal to the charging voltage adjusting unit 440 to be described later, and allows the battery cell 100 to be charged with the set charging voltage.

Here, the charging voltage (CV) means a voltage with which the battery cell is currently charged.

In addition, the reference time indicates an exposure time while the battery cell 100 is exposed to a temperature and a cell voltage equal to or greater than the reference temperature and the reference voltage, respectively, to cause the reaction gas inside the battery cell 100 to be able to abruptly increase.

When receiving the time excess signal from the counting unit 420, the calculation unit 430 calculates the dropped charging voltage (NCV) that is a voltage dropped by the set voltage (DV) from the charging voltage (CV) that is a voltage with which the battery cell is currently charged.

The dropped charging voltage (NCV) may be calculated by the following Equation (1).

$$\text{Dropped charging voltage (NCV)} = \text{charging voltage (CV)} - \text{setting voltage (DV)} \quad (1)$$

In other words, that the time excess signal has been transmitted is determined that the charging voltage (CV), with which the battery cell is currently charged, is to be lowered, since when charging is continued with the charging voltage (CV) with which the battery cell is currently charged, it is determined that swelling is highly possible to occur due to continuation of a state where the temperature and the cell voltage of the battery cell are equal to or higher than the reference temperature and the reference cell voltage, respectively.

Accordingly, it is intended to charge the battery cell with the dropped charging voltage (NCV) by calculating the dropped charging voltage (NCV) that is a voltage lowered by a preset setting voltage (DV) from the charging voltage (CV) with which the battery cell is currently charged.

Here, the setting voltage may be changed by setting at the time of manufacturing the battery pack, and is set to lower the charging voltage for charging the battery cell so as to lower the temperature and the cell voltage of the battery cell.

In addition, the calculating unit 430 is configured to transmit the calculated value of the dropped charging voltage to the charging voltage adjusting unit 440 to be described later.

The charging voltage adjusting unit 440 is configured to change the battery charging voltage to have the calculated value of the dropped charging voltage, and allows the battery cell to be charged with the dropped charging voltage (NCV).

The adjustment of the charging voltage in this way may be implemented through a known voltage dropping circuit to be configured in a device in which the battery is mounted or to be implemented in an output stage of a charger, Or may be configured such that the charger changes an output voltage to the dropped charging voltage through data communication with the device.

In addition, when receiving the charging voltage maintaining signal from the comparing unit 410 and the counting unit 420, the charging voltage adjusting unit 440 maintains, as a voltage for charging the battery cell, the charging voltage (CV) for currently charging the battery cell on the basis of the charging voltage maintaining signal.

In addition, when a voltage value transmitted from the calculating unit 430 is the minimum charging voltage value or greater, the charging voltage adjusting unit 440 allows the battery cell 100 to be charged with the calculated dropped charging voltage, and when a voltage value transmitted from the calculating unit 430 is smaller than the value of the minimum charging voltage, the charging voltage adjusting unit 440 adjusts the charging voltage of the battery cell 100 such that the battery cell 100 is charged with the minimum charging voltage (MCV).

Here, the minimum charging voltage means the smallest charging voltage among charging voltages set for charging the battery cell, namely, the smallest voltage for charging the battery cell Accordingly, when the dropped charging voltage (NCV), which is calculated by dropping the charging voltage (CV) of the current battery cell by the preset setting voltage (DV), is smaller than the minimum charging voltage, it is determined that the battery cell may not be charged with the dropped charging voltage (NCV).

Accordingly, the battery cell may not be charged with the dropped charging voltage (NCV) and the swelling is high possible to occur, when the battery cell is charged with the current charging voltage (CV). Therefore it is intended to reduce a danger of occurrence of the swelling by charging the battery cell with the minimum charging voltage that is the smallest voltage among the charging voltages.

As described above, according to the method for preventing swelling of the battery cell of the present disclosure, when a temperature of the reference temperature or higher and a cell voltage of the reference cell voltage or higher are maintained for the reference time or longer, the battery cell is allowed to be out of swelling occurrence conditions by dropping the charging voltage (CV) and charging the battery cell with the dropped charging voltage, which results to lower the temperature of the battery cell and lower the cell voltage to the reference voltage or smaller. Therefore, the occurrence of the swelling phenomenon may be prevented in advance.

The invention claimed is:

1. A method for preventing swelling of a battery cell, comprising:
   a measuring process of measuring a temperature and a cell voltage of the battery cell in charge;
   a determining process of determining whether the measured temperature and the measured cell voltage of the battery cell are equal to or greater than a reference temperature and a reference cell voltage, respectively;
   a counting process of starting counting from a time when the temperature and the cell voltage of the battery cell become equal to or greater than the reference temperature and the reference cell voltage, respectively;
   a cell charging process of charging the battery cell with a dropped charging voltage (NCV) obtained by dropping a charging voltage (CV) of the battery cell by a preset setting voltage (DV), when the counted time is a set reference time or longer; and
   a minimum charging voltage maintaining process of maintaining the dropped charging voltage (NCV) to a preset minimum charging voltage (MCV) or greater.

2. The method of claim 1, wherein in the determining process, when the measured temperature or the measure cell voltage of the battery cell is smaller than the reference temperature or the reference cell voltage, respectively, the charging voltage is maintained to charge the battery cell.

3. The method of claim 1, wherein in the counting process, when the counted time is shorter than the reference time, the charging voltage (CV) is maintained to charge the battery cell.

4. The method of claim 1, wherein in the cell charging process, the dropped charging voltage (NCV) is calculated according to a following Equation:

dropped charging voltage (NCV)=charging voltage (CV)−setting voltage (DV).

5. The method of claim 1, wherein in the minimum charging voltage maintaining process, when the dropped charging voltage (NCV) is the minimum charging voltage (MCV) or greater, the battery cell is charged with the dropped charging voltage (NCV), and when the dropped charging voltage (NCV) is smaller than the minimum charging voltage (MCV), the battery cell is charged with the minimum charging voltage (MCV).

6. A battery pack comprising:
   a battery cell;
   a temperature sensing unit configured to measure a temperature of the battery cell;
   a voltage measuring unit configured to measure a cell voltage of the battery cell; and
   a control unit configured to control the charging voltage (CV) according to the temperature and the voltage respectively acquired from the temperature sensing unit and the voltage measuring unit, respectively, wherein the control unit comprises:
   a comparing unit configured to compare the temperature and the cell voltage with a reference temperature and a reference voltage;
   a counting unit configured to count from a time when the measured temperature and the measured cell voltage are equal to or greater than the reference temperature and the reference voltage, respectively;
   a calculating unit configured to drop the charging voltage by a preset voltage, when the time counted by the counting unit is a reference time or longer; and
   a charging voltage adjusting unit configured to adjust the charging voltage.

7. The battery pack of claim 6, wherein the comparing unit compares the temperature and the cell voltage with the reference temperature and the reference cell voltage, respectively, and transmits a counting signal to the counting unit, when the measured temperature and the measured cell voltage of the battery cell are equal to or greater than the reference temperature and the reference cell voltage, respectively.

8. The battery pack of claim 7, wherein the counting unit further comprises:
   a second counter configured to count a time in seconds from a time when the counting signal has been transmitted; and
   an hour counter configured to count when the time counted by the second counter is a set time or greater.

9. The battery pack of claim 6, wherein the calculating unit calculates the dropped charging voltage dropped by a present voltage from the charging voltage according to a following equation, when the counted time is a set time or greater:

dropped charging voltage (NCV)=charging voltage (CV)−preset voltage (DV).

10. The battery pack of claim 9, wherein the charging voltage adjusting unit adjusts the charging voltage such that the battery cell is charged with the dropped charging voltage calculated in the calculating unit, and when the dropped charging voltage is calculated to be smaller than a minimum charging voltage, the charging voltage adjusting unit adjusts the charging voltage such that the battery cell is charged with the minimum charging voltage.

* * * * *